(12) United States Patent
Kawasaki et al.

(10) Patent No.: US 7,145,176 B2
(45) Date of Patent: Dec. 5, 2006

(54) ACTIVE MATRIX DISPLAY DEVICE

(75) Inventors: Masahiro Kawasaki, Hitachi (JP);
Masahiko Ando, Hitachinaka (JP);
Masatoshi Wakagi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 677 days.

(21) Appl. No.: 09/940,885

(22) Filed: Aug. 29, 2001

(65) Prior Publication Data

US 2002/0145143 A1   Oct. 10, 2002

(30) Foreign Application Priority Data

Apr. 5, 2001   (JP)   ............... 2001-106611

(51) Int. Cl.
*H01L 29/76*   (2006.01)
*G02F 1/136*   (2006.01)

(52) U.S. Cl. .................. 257/72; 257/410; 257/66; 257/347; 257/353; 257/59; 349/42; 349/43; 349/110

(58) Field of Classification Search .............. 349/43, 349/46, 42, 122, 138, 160, 38
See application file for complete search history.

(56) References Cited

U.S. PATENT DOCUMENTS

| 4,760,389 | A | * | 7/1988 | Aoki et al. ............... 345/102 |
| 5,569,932 | A | * | 10/1996 | Shor et al. ................ 257/3 |
| 5,576,231 | A | * | 11/1996 | Konuma et al. ........... 438/151 |
| 5,644,156 | A | * | 7/1997 | Suzuki et al. ............. 257/485 |
| 5,747,355 | A | * | 5/1998 | Konuma et al. ........... 437/41 |
| 6,054,363 | A | * | 4/2000 | Sakaguchi et al. ........ 438/406 |
| 6,140,164 | A | * | 10/2000 | Zhang ...................... 438/163 |
| 6,215,244 | B1 | * | 4/2001 | Kuribayashi et al. ..... 313/505 |
| 6,271,101 | B1 | * | 8/2001 | Fukunaga ................. 438/455 |
| 6,285,118 | B1 | * | 9/2001 | Hatai et al. .............. 313/310 |
| 6,335,231 | B1 | * | 1/2002 | Yamazaki et al. ........ 438/151 |
| 6,344,375 | B1 | * | 2/2002 | Orita et al. .............. 438/151 |
| 6,362,027 | B1 | * | 3/2002 | Yamazaki et al. ........ 438/149 |
| 6,674,093 | B1 | * | 1/2004 | Tanaka et al. ............ 257/72 |
| 2002/0137265 | A1 | * | 9/2002 | Yamazaki et al. ........ 438/150 |

FOREIGN PATENT DOCUMENTS

| JP | 4-299571 | * 10/1992 |
| JP | 7135323 | 5/1995 |
| JP | A 9-96836 | 4/1997 |
| JP | A 11-274514 | 10/1999 |
| JP | 2001032086 | 2/2001 |

OTHER PUBLICATIONS

Search Report dated Nov. 1, 2003.

* cited by examiner

*Primary Examiner*—Nathan J. Flynn
*Assistant Examiner*—Fazli Erdem
(74) *Attorney, Agent, or Firm*—Antonelli, Terry, Stout and Kraus, LLP.

(57) ABSTRACT

An active matrix display device using a thin film transistor as a switching element in the displaying portion or driving portion is characterized in that said thin film transistor includes an insulating substrate on which a gate electrode, a gate insulating film, a semiconductor layer, a drain electrode, a source electrode and a passivation film are successively laminated. The thin film transistor is further characterized such that the surface portion of the semiconductor layer on the side of the passivation film is porous, which enables the device to be stably driven with a low off-current even in the case of disposing an organic passivation film and a picture element electrode on the thin film transistor.

13 Claims, 6 Drawing Sheets

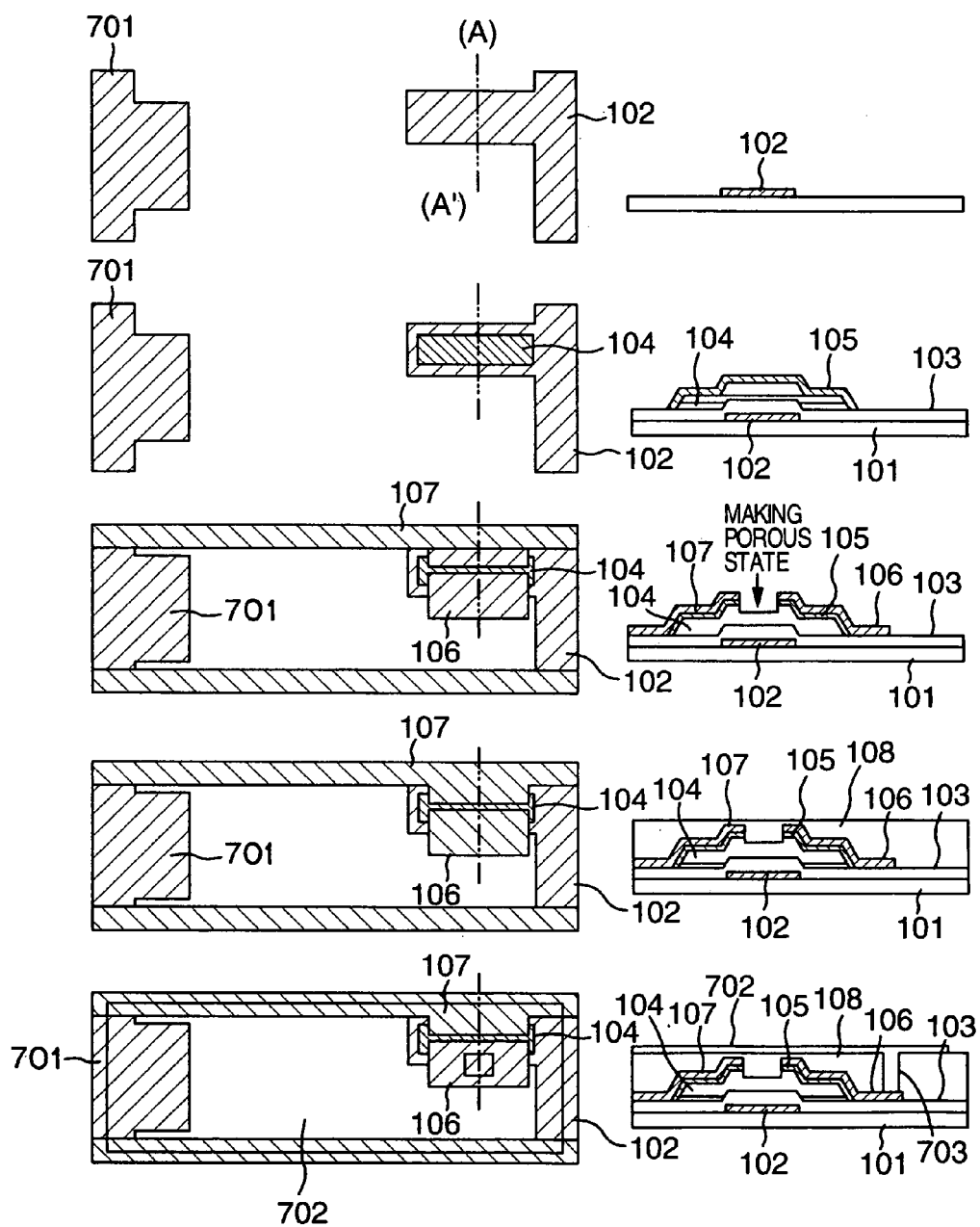

ACTIVE MATRIX DISPLAY DEVICE

BACKGROUND OF THE INVENTION

The present invention relates to an active matrix display device and a method for producing a thin film transistor.

Hitherto, for example, according to the method disclosed in JP-A-9-96836, a plasma treatment is carried out using an inert element such as Ar to damage the interface of the back channel and allow the back channel area to contain 0.1–1.0 atom % of Ar, thereby increasing the surface state density and thus obtaining the effect to reduce the off-state current.

According to the scheme disclosed in JP-A-11-274514, the characteristics of thin film transistors are improved by subjecting amorphous silicon to dry etching, followed by carrying out a plasma treatment with helium.

Conventional liquid crystal display devices suffer from the problems that when coating type passivation films such as polyimide and polydisilazane or when wiring or picture element electrodes are provided on thin film transistors, the devices are affected by fixed charge in the passivation film or potential of the picture element electrode, resulting in an increase of off-state current to cause deterioration of display characteristics.

BRIEF SUMMARY OF THE INVENTION

The present invention provides an active matrix liquid crystal display device which is stable against a fixed charge in a coating type passivation film or potential of the wiring and picture element electrode.

The present invention provides an active matrix display device using a thin film transistor as a switching element in the displaying portion or driving portion, characterized in that said thin film transistor comprises an insulating substrate on which a gate electrode, a gate insulating film, a semiconductor layer, a drain electrode, a source electrode and a passivation film are successively laminated, and the surface of the semiconductor layer on the side of the passivation film is porous.

The present invention further provides a method for making a thin film transistor which includes the following steps:

a step of forming successively a gate insulating film, a semiconductor layer and a contact layer on a gate electrode formed on an insulating substrate and etching the semiconductor layer and the contact layer in the form of islands, a step of forming a metallic layer on the substrate after subjected to the preceding step and forming a drain electrode and a source electrode by etching the metallic layer, a step of removing by etching the impurity semiconductor layer and a part of the semiconductor layer exposed between the drain electrode and the source electrode on the substrate after subjected to the preceding step, a step of irradiating with ion the surface of the semiconductor layer exposed between the drain electrode and the source electrode on the substrate after subjected to the preceding step, thereby making porous the surface of the semiconductor layer, and a step of forming a passivation film on the substrate after subjected to the preceding step.

BRIEF DESCRIPTION OF THE DRAWINGS

FIG. 7 is a view showing one embodiment of a planar structure and a sectional structure of the picture element portion in the liquid crystal display device of the present invention.

DETAILED DESCRIPTION OF THE INVENTION

Figure 1:
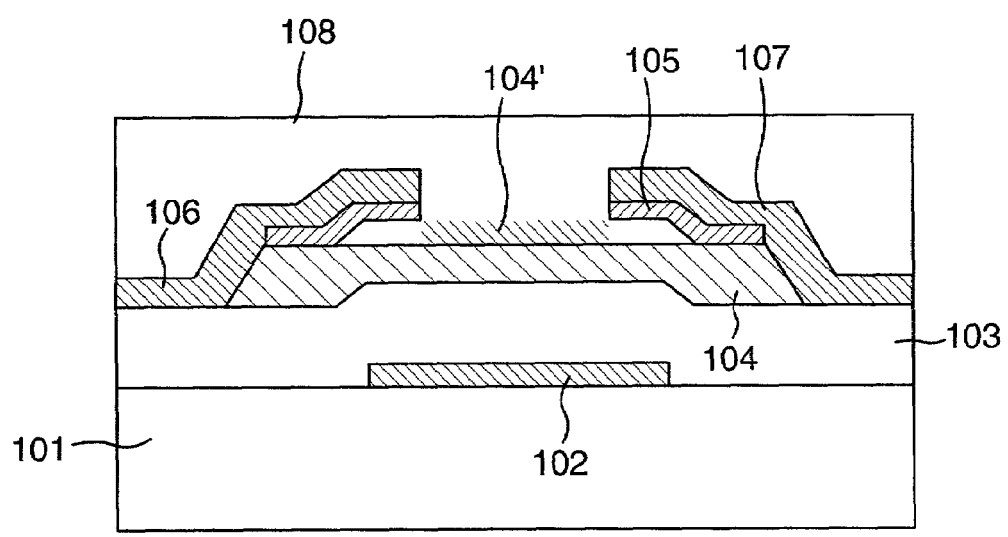
FIG. 1 is a sectional view showing the structure of a thin film transistor which is an embodiment of the present invention.

The present invention provides an active matrix display device using a thin film transistor as a switching element in the displaying portion or driving portion, characterized in that said thin film transistor comprises an insulating substrate on which a gate electrode, a gate insulating film, a semiconductor layer, a drain electrode, a source electrode and a passivation film are successively laminated, and the surface portion of the semiconductor layer on the opposite side to the gate electrode is porous. These characteristics and other characteristics will be explained by the following descriptions.

Active matrix liquid crystal display devices using a switching element are used as monitors for personal computers, work stations and televisions since they provide a high image quality similar to that of a CRT and are less in consumption of power and smaller in size than a CRT. As the switching elements, thin film transistors superior in productivity and switching performance have been used. One example of a structure of the thin film transistor, and steps for making thin film transistor array substrate will be explained. A metallic thin film is formed on a transparent insulating glass substrate, and a gate electrode is formed by a wet etching method using a resist pattern as a mask. Then, on the gate electrode are successively formed an insulating film such as of silicon nitride, a semiconductor layer such as of amorphous silicon, and a contact layer doped with impurity such as phosphorus. By a dry etching method using a resist pattern formed thereon as a mask, islands of the semiconductor layer and the contact layer are formed just above the gate electrode. Then, a metallic thin film is formed, followed by subjecting that film to a wet etching method using a resist pattern as a mask to form a drain electrode and a source electrode on the contact layer. Thereafter, the contact layer and a surface portion of 30–50 nm in depth of the semiconductor layer which are exposed between the drain electrode and the source electrode are removed by a dry etching method. Then, the whole of the thin film transistor array is covered with a coating type passivation film obtained by heat treating an organic compound such as polyimide or an inorganic compound such as polydisilazane at 200° C. or a passivation film such as an inorganic insulating film comprising silicon nitride or the like and a laminate film thereof, and a contact hole is provided in the portion of the source electrode. Finally, a transparent electrode such as ITO is formed at the picture element portion in the case of a transmission type liquid crystal display device and a reflective electrode such as Al is formed at the picture element portion in the case of a reflection type liquid crystal display device, followed by connecting it with the source electrode through the contact hole to complete a thin film transistor array substrate.

When a coating type passivation film such as of polyimide or polydisilazane is used as the passivation film in the thin film transistor, this film can be formed in a shorter time as compared with using silicon nitride as the passivation film. Therefore, productivity is improved and reduction of cost is possible. However, there is a problem that if the liquid crystal display device is used for a long period of time, charge is injected into the passivation film from the signal line metallic layer or the semiconductor layer, and due to the influence of the injected charge, there may occur an increase of leak current at off-state of the thin layer transistor (hereinafter referred to as "off-state current"), causing a problem in the off-state current.

There is another problem that in case the picture element electrode which is used as reflective electrode is provided above the thin film transistor, aperture ratio of the picture element portion increases and luminance of the liquid crystal display device is improved, but off-state current of the thin film transistor increases owing to the effect of the potential of the picture element electrode.

The phenomenon of increase in off-state current of the thin film transistor, as mentioned above, takes place because band bending occurs in the area of 1–30 nm from the surface of the semiconductor layer on the passivation film side due to the effect of positively charged fixed charge in the passivation film or potential of the picture element electrode, thereby forming a channel in that area (hereinafter referred to as "back channel") to result in increase of leak current of the back channel. A known and effective way to reduce the leak current is to increase the number of dangling bonds of the semiconductor in the back channel area. For example, the reduction of the off-state current is obtained by carrying out a plasma treatment using an inert element such as Ar to cause damages at around the interface of the back channel to allow the back channel area to contain 0.1–1.0 atom % of Ar, thereby resulting in increase of surface state density. However, effecting a reduction this way is insufficient. When a voltage of 30 V is applied to the back gate, the off-state current is higher by two to three figures than the off-state current in the case of grounding the back gate. This is because Si—H bonds or Si—Si bonds in silicon are cut by the plasma treatment to produce dangling bonds, but most of them are re-bonded in the course of subsequent heat treatment and disappear, and only the dangling bonds in the area where re-bonding of the dangling bonds is hindered by Ar atoms remaining in silicon are retained. This method has the problem that the number of the dangling bonds produced is small, and image quality of the display device is deteriorated due to the trouble of off-state current in the case of using an organic film of low dielectric constant containing a large amount of fixed charge as a passivation film of the thin film transistor or in the case of the thin film transistor being covered with a reflective electrode. Furthermore, characteristics of thin film transistor are improved by dry etching amorphous silicon, followed by subjecting to helium plasma treatment. However, there is still a problem that according to the generally known helium plasma treatment which treats the surface of semiconductor with mainly radicals of helium, image quality of the display device is deteriorated due to the trouble of off-state current in the case of using an organic film of low dielectric constant containing a large amount of fixed charge as a passivation film of the thin film transistor or in the case of the thin film transistor being covered with a reflective electrode.

The present invention provides an active matrix display device using a thin film transistor as a switching element in the displaying portion or driving portion, characterized in that said thin film transistor comprises an insulating substrate on which a gate electrode, a gate insulating film, a semiconductor layer, a drain electrode, a source electrode and a passivation insulating film are successively laminated, and the surface portion of the semiconductor layer on the opposite side to the gate electrode is porous.

In order to further diminish the trouble of off-state current of thin film transistor over conventional techniques, the number of dangling bonds of semiconductor in the back channel area must be greatly increased. Thus, the present invention utilizes the dangling bonds present at high density on the surface of the semiconductor. For the increase of the surface area of the semiconductor in the back channel area, the thin film transistor has such a structure that the surface of the semiconductor layer is made porous. Depth of the porous portion is not less than 1 nm and not more than 30 nm.

Here, "porous" is defined as follows: The proportion of the voids formed by falling off of Si which is a constituent element is not lower than 5% and is lower than 80%, and average value of the void size (radius of voids) is not more than 5 nm.

Furthermore, the meaning of not less than 1 nm and not more than 30 nm in depth of the porous portion from the surface of the semiconductor layer is such that it covers the back channel area and does not affect the conductivity of the front channel comprising the surface of the semiconductor on the side of the gate insulating film.

There are several methods for making porous the surface portion of the semiconductor layer.

One example is to irradiate the surface of the semiconductor layer with ion accelerated by electric field. As the ion, He ion which is small in atomic radius and inert is optimum because size of the resulting voids is small.

Another example is an anode oxidation method which comprises dipping a gate electrode as an anode and platinum as a cathode in hydrofluoric acid and passing a current between them, thereby making porous the surface of the semiconductor layer. When this method is used, the semiconductor layer is preferably polycrystalline or single crystalline.

A further example is to use a self-organized resist comprising a mixture of two macromolecules differing in molecular weight. The self-organized resist is coated on the surface of the semiconductor exposed between the source electrode and the drain electrode and then annealed, whereby the macromolecule of smaller molecular weight is self-organized in the form of a network. This portion can be selectively etched to form voids of several nm in radius in the surface portion of the semiconductor and thus this portion can be made porous.

The construction, action and principle of the liquid crystal display device of the present invention will be explained below.

The shape of the voids varies depending on the production method thereof. In the case of irradiating the surface of the semiconductor with ion, the voids are not uniform, but have the shape close to sphere or column, and in the case of using the anode oxidation method or using the self-organized resist, the voids have the shape close to that of a column.

The total surface area of the voids in unit volume is shown by S, the number of the voids in unit volume is shown by n, the average value of the void radius is shown by r, and the volume density of the voids is shown by N.

The following formulas are obtained if the voids are approximated to be spherical in shape.

$$N = 4/3 \cdot \pi r^3 \cdot n \qquad (1)$$

$$S = 4\pi r^2 \cdot n \qquad (2)$$

When n is eliminated from the formulas ① and ②, and arrangement is made on S, the following formula is obtained.

$$S = 3N/r \qquad (3)$$

Furthermore, when the voids are approximated to be columnar, similarly the following formula is obtained.

$$S = 2N/r \qquad (4)$$

From the formulas ③ and ④, it can be seen that in either case of the voids having a shape close to that of a sphere or column, the total surface area S of the voids in unit volume is proportional to the volume density N of the voids and is inversely proportional to average value r of the void radius. Therefore, for efficient utilization of the dangling bonds present on the surface of the semiconductor, the volume density N of the voids may be made higher and the average value r of the void radius may be made smaller to make the total surface area S as small as possible.

A second gate electrode (hereinafter referred to as "back gate electrode") is provided on the thin film transistor with a passivation film being present therebetween, and a voltage of −40 V to +40 V is applied to the back gate electrode to measure the dependence, on the gate voltage, of the current passing between the source electrode and the drain electrode of the thin film transistor (hereinafter referred to as "Id-Vg characteristics"). It has been found that when treating conditions are changed in making porous the surface of the semiconductor by irradiating the surface with He ion, thereby changing the average value r of the void radius and the void density N, and when they satisfy the conditions of the following formula, the current value between the source electrode and the drain electrode in the case of applying a voltage of −40 V to +40 V to the back gate electrode is not more than 10 times the current value between the source electrode and the drain electrode in the case of providing no back gate electrode.

$$N/r \geq 8 \times 10^2 (nm^{-1}) \qquad (5)$$

When the surface state of the semiconductor present per unit area is shown by $D_f$, defect states of the semiconductor present per unit volume is shown by $D_v$, and ratio of the number of dangling bonds of the semiconductor present per unit volume in the porous portion and the number of dangling bonds of the semiconductor of bulk present per unit volume is shown by R, the relation of the following formula is obtained.

$$R = S \cdot D_f / D_v \qquad (6)$$

According to the literature MARTIN J. POWELL: IEEE TRANCTIONS ON ELECTRON DEVICE. VOL.36, NO.12, P.2761 (1989), for example, as for amorphous silicon, surface state of $2 \times 10^{12}$ (cm$^{-2}$ eV$^{-1}$) is present on the surface and defect state of $1 \times 10^{16}$ (cm$^{-3}$ eV$^{-1}$) is present in the bulk. These values and the formulas ③ and ④ are substituted for those in the formula ⑥ to obtain the following formula.

$$R > 5 \times 10^2$$

That is, in order that the current value between the source electrode and the drain electrode in the case of applying a voltage of −40 V to +40 V to the back gate electrode is not more than 10 times the current value in the case of providing no back gate electrode, it is necessary that the number of the dangling bonds of the porous portion is more than $5 \times 10^2$ times the number of the dangling bonds of the bulk portion.

When columnar or spherical voids are most closely packed in the semiconductor, the void density is less than 80%, and when the void radius is made as small as possible, the limit of void radius is about 1 nm in view of the production method. Therefore, the density of the voids is desirably not less than 5% and the void radius is desirably not more than 5 nm to satisfy the conditions of the formula ⑤.

Upon satisfying the above conditions, stable characteristics are obtained even in the case of using as the passivation film the coating type insulating film which is greatly affected by fixed charge or even in the case of the reflective electrode covering the thin film transistor.

Even when a part or all of the voids are filled with the passivation film formed later, the same effect can be obtained because the dangling bonds remain at the interface of the semiconductor and the passivation film.

The main reason for stable characteristics being also obtained in the case of using as the passivation film the coating type passivation film which is greatly affected by fixed charge or in the case of the reflective electrode covering the thin film transistor is that the dangling bonds of the back channel portion greatly increase.

Furthermore, since resistance is inversely proportional to sectional area of the path of current, the additional reason is that resistance of the back channel increases due to the decrease of the effective sectional area of the current path caused by making porous the back channel.

Preferred embodiments of the active matrix display device and the method for making a thin film transistor used in the device according to the present invention are as follows.

(1) An active matrix display device using a thin film transistor as a switching element in the displaying portion or driving portion, characterized in that said thin film transistor comprises an insulating substrate on which a gate electrode, a gate insulating film, a semiconductor layer, a drain electrode, a source electrode and a passivation film are successively laminated, and the surface of the semiconductor layer on the passivation film side is porous.

(2) An active matrix display device mentioned in the above (1), wherein depth of the porous portion is not less than 1 nm and not more than 30 nm from the surface of the semiconductor layer on the passivation film side.

(3) An active matrix display device mentioned in the above (1), wherein the volume of the voids is not less than 5% in the porous area of not less than 1 nm and not more than 30 nm from the surface of the semiconductor layer on the passivation film side.

(4) An active matrix display device mentioned in the above (1), wherein the average value of void radius in the porous portion is not more than 5 nm.

(5) An active matrix display device mentioned in the above (1), wherein not less than 0.01 atom % and not more than 0.1 atom % of helium is contained in the porous area of the semiconductor layer not more than 30 nm in depth from the surface of the semiconductor layer on the passivation film side.

(6) An active matrix display device mentioned in the above (1), wherein the passivation film is of an organic resin.

(7) An active matrix display device mentioned in the above (1), wherein a picture element electrode formed on the passivation film of the switching element overlaps the switching element.

(8) An active matrix display device mentioned in the above (1), wherein a common electrode formed on the passivation film of the switching element overlaps the switching element.

(9) An active matrix display device mentioned in the above (1), wherein the current value between the source electrode and the drain electrode in the case of applying a voltage of −40 V to +40 V to a second electrode (a back gate electrode) provided on the switching element is not more than 10 times the current value in the case of providing no back gate electrode.

(10) A method for making a thin film transistor which includes the following steps:

a step of forming successively a gate insulating film, a semiconductor layer and a contact layer on a gate electrode formed on an insulating substrate, and etching the semiconductor layer and the contact layer in the form of islands, a step of forming a metallic layer on the substrate after subjected to the preceding step and forming a drain electrode and a source electrode by etching the metallic layer, a step of removing by etching the impurity semiconductor layer and a part of the semiconductor layer which are exposed between the drain electrode and the source electrode on the substrate after subjected to the preceding step, a step of irradiating with ion the surface of the semiconductor layer exposed between the drain electrode and the source electrode on the substrate after subjected to the preceding step, thereby making porous the surface of the semiconductor layer, and a step of forming a passivation film on the substrate after subjected to the preceding step.

(11) A method for making a thin film transistor as mentioned in the above (10), wherein the ion irradiated to the surface of the semiconductor layer exposed between the drain electrode and the source electrode on the substrate is He ion.

(12) A method for making a thin film transistor which includes the following steps:

a step of forming successively a gate insulating film, a semiconductor layer and a contact layer on a gate electrode formed on an insulating substrate, and etching the semiconductor layer and the contact layer in the form of islands, a step of forming a metallic layer on the substrate after subjected to the preceding step and forming a drain electrode and a source electrode by etching the metallic layer, a step of removing by etching the contact layer and a part of the semiconductor layer which are exposed between the drain electrode and the source electrode on the substrate after subjected to the preceding step, a step of making porous the surface of the semiconductor layer exposed between the drain electrode and the source electrode on the substrate after subjected to the preceding step by anode oxidation method, and a step of forming a passivation film on the substrate after subjected to the preceding step.

(13) A method for making a thin film transistor which includes the following steps:

a step of forming successively a gate insulating film, a semiconductor layer and a contact layer on a gate electrode formed on an insulating substrate, and etching the semiconductor layer and the contact layer in the form of islands, a step of forming a metallic layer on the substrate after subjected to the preceding step and forming a drain electrode and a source electrode by etching the metallic layer, a step of removing by etching the contact layer and a part of the semiconductor layer which are exposed between the drain electrode and the source electrode on the substrate after subjected to the preceding step, a step of coating a self-organized resist comprising two macromolecules differing in molecular weight on the surface of the semiconductor layer exposed between the drain electrode and the source electrode on the substrate after subjected to the preceding step, annealing the coat and, then, etching fine particles in the self-organized macromolecule mixture and the semiconductor layer under the fine particles, thereby making porous the surface of the semiconductor layer, and a step of forming a passivation film on the substrate after subjected to the preceding step.

The present invention will be specifically explained by the following examples, which should not be construed as limiting the invention in any manner.

EXAMPLE 1

FIG. 1 illustrates a sectional structure of the thin film transistor which shows the first embodiment of the present invention. This structure is characterized by so-called inverted staggered structure where the source electrode and the drain electrode are positioned above the gate electrode. The reference numeral 101 indicates an insulating glass substrate, 102 indicates a gate electrode comprising Cr, 103 indicates a gate insulating film comprising silicon nitride, 104 indicates a semiconductor layer comprising, for example, amorphous silicon where the area (104') of 10 nm to 30 nm in depth in the surface portion is porous, 105 indicates a contact layer comprising, for example, $n^+$ type amorphous silicon doped with phosphorus, 106 and 107 indicate source and drain electrodes comprising Cr, and 108 indicates a passivation film comprising polyimide.

Figure 2:
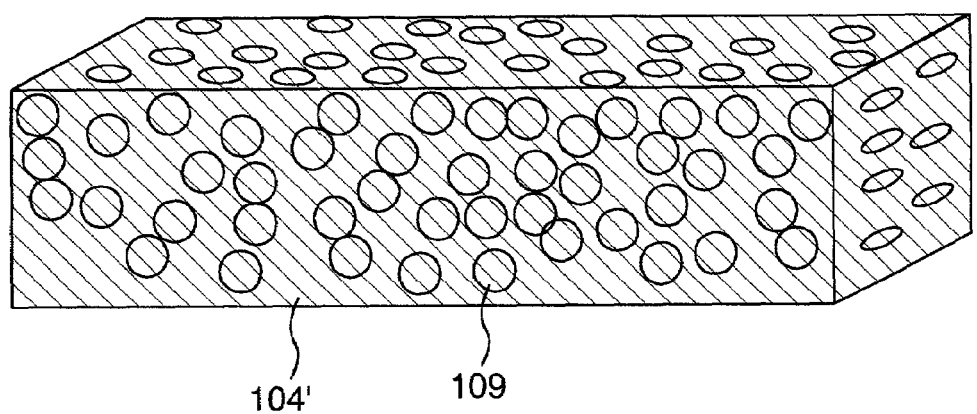
FIG. 2 is a sectional oblique view of the porous portion of the semiconductor in the thin film transistor which is an embodiment of the present invention.
Figure 6:
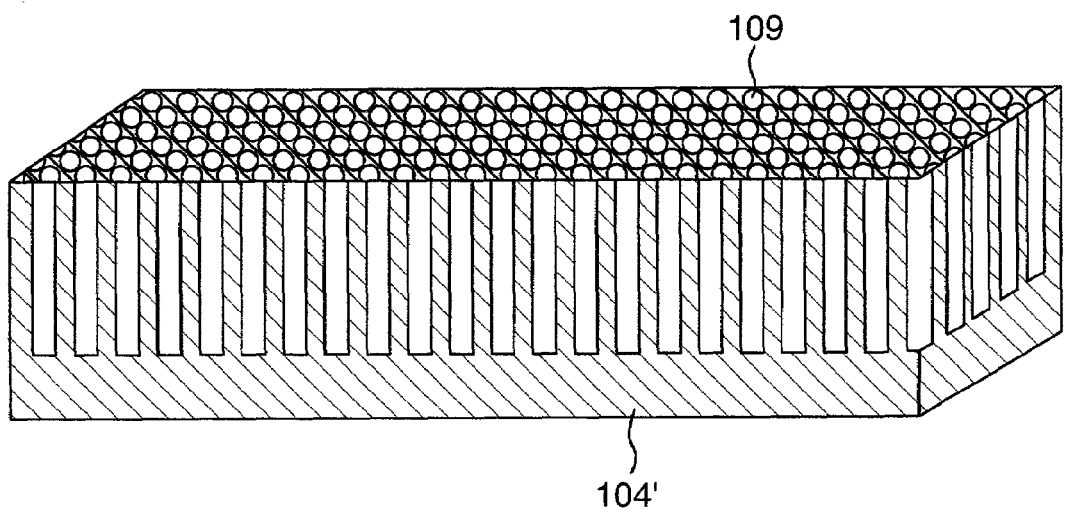
FIG. 6 is a sectional oblique view of the porous portion of the semiconductor in the thin film transistor which is an embodiment of the present invention.

The TFT having the above structure was made in the following manner. First, a Cr film of about 120 nm in thickness was formed by a sputtering method on the CORNING 1737 glass substrate 101. The Cr was subjected to patterning by photolithography to form a gate electrode 102. Thereon were formed successively the following thin films using a plasma chemical vapor deposition (CVD) method. First, a gate insulating film 103 of 300 nm thick comprising a silicon nitride film was formed using a mixed gas comprising $SiH_4$, $NH_3$, $N_2$, and the like. Thereon were successively formed an amorphous silicon film of about 150 nm thick using, for example, a mixed gas comprising $SiH_4$ and $H_2$, and an $n^+$ type amorphous silicon film using a mixed gas comprising SiH and $PH_3$. The $n^+$ type amorphous silicon film and the amorphous silicon film were simultaneously processed in the form of islands by photolithography to form a semiconductor layer 104. A Cr film of about 120 nm thick formed thereon using a sputtering method was subjected to patterning by photolithography to form a source electrode 106 and a drain electrode 107. Furthermore, the n+ type amorphous silicon film between the source/drain electrodes and the portion of the semiconductor layer of 50 nm in depth from the surface in which phosphorus might diffuse were removed by etching to form a contact layer 105 among the source electrode 106 and drain electrode 107 and the semiconductor layer 104. Thereafter, in the present invention, the substrate was disposed on a cathode electrode and the surface of the exposed semiconductor layer 104 was irradiated for 5 seconds or more of He ion using, for example, a reactive ion etching apparatus under the conditions of an electric power of 300 W and a pressure of 5–20 Pa. In this case, the area of 1–30 nm from the surface of the semiconductor layer was made porous as shown in FIG. 2 or FIG. 6. Since the irradiated He ions are small in atomic radius and light in weight, they fell off at the subsequent heat treating step, and the amount of the He ions remaining in the amorphous silicon was not less than 0.01 atom % and is less than 0.1 atom %. Finally, a passivation film 108 capable of being formed by a coating method of low cost such as a spin coating, e.g., an organic insulating film of 1 μm thick comprising polyimide, or a coating type silicon oxide film obtained by heat treating polydisilazane at 200° C., was formed so as to cover the whole TFT, thereby completing a thin film transistor.

In this embodiment, the semiconductor layer is comprised of amorphous silicon, but may comprise microcrystalline silicon, polycrystalline silicon, or single crystalline silicon. Furthermore, the passivation film may be formed by subjecting to photolithography a silicon nitride film of 300 nm thick deposited by a plasma CVD method using a mixed gas comprising $SiH_4$, $NH_3$, $N_2$, and the like.

Figure 3:
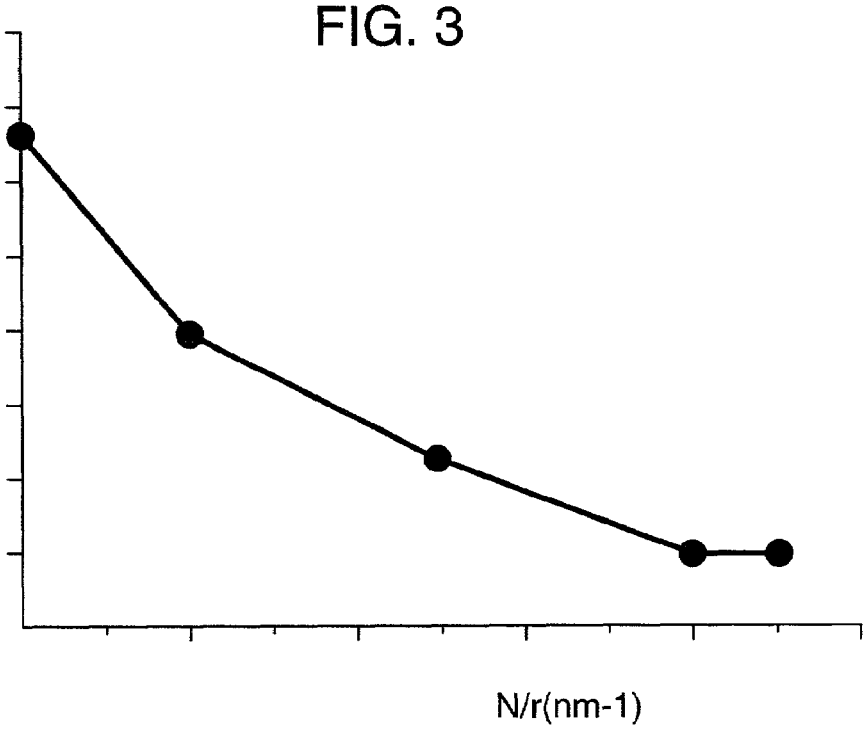
FIG. 3 is a graph showing the relation between N/r and a ratio of the current value between the source and drain electrodes in the case of applying a voltage of +40 V to the back gate electrode and the current value in the case of providing no back gate electrode.

Radius of the voids in the semiconductor portion made porous under the above-mentioned conditions and volume density of the voids were measured by a sectional TEM (transmission electron microscope) and by a spectroscopic ellipsometry spectrum, respectively. Moreover, a back gate was provided on the thin film transistor with the passivation film being present therebetween, and Id-Vg characteristics were also measured. FIG. 3 is a graph in which the ordinate axis shows a ratio of current value between source and drain in the case of applying a voltage of +40 V to the back gate electrode and current value between source and drain in the case of providing no back gate electrode, and the abscissa axis shows N/r. When $N/r \geq 8\times10^{-2} (nm^{-1})$ was satisfied, the current value between the source and the drain in the case of applying a voltage of +40 V to the back gate electrode was not more than 10 times the current value in the case of providing no back gate electrode.

Figure 4:
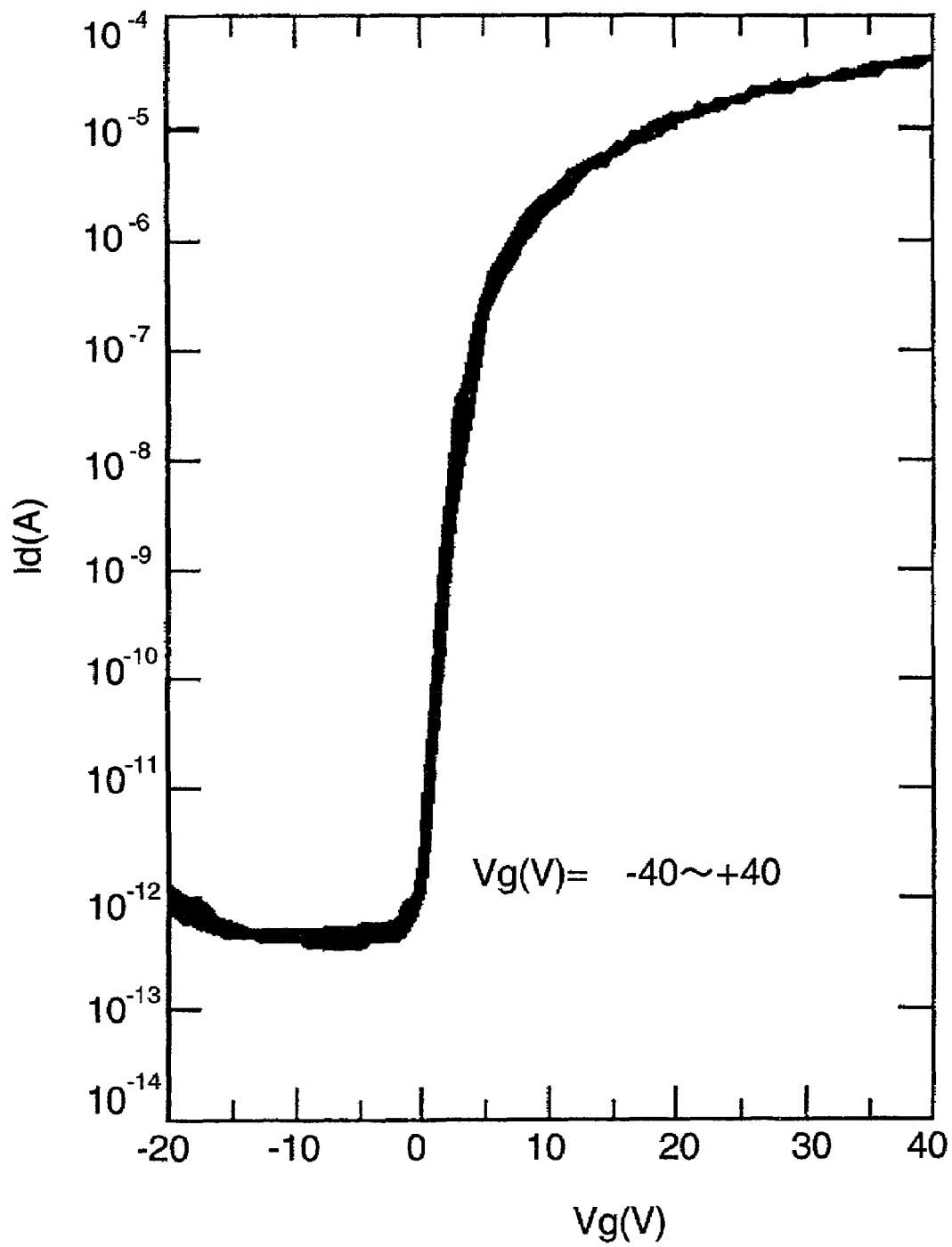
FIG. 4 is a graph showing dependence, on the back gate voltage, of the Id-Vg characteristics of the thin film transistor in a liquid crystal display device of an example of the present invention.
Figure 5:
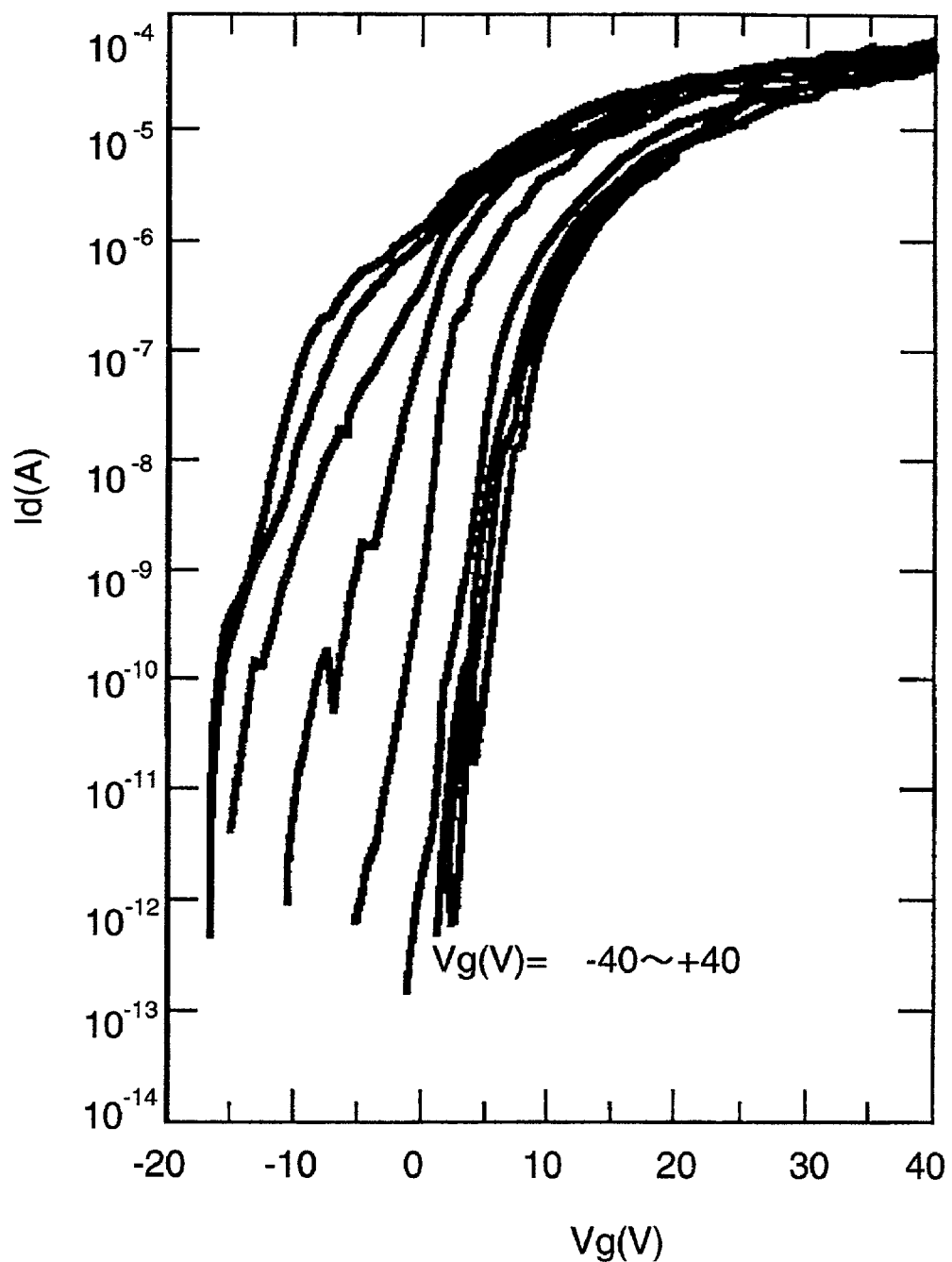
FIG. 5 is a graph showing dependence, on the back gate voltage, of Id-Vg characteristics of the thin film transistor in a liquid crystal display device of a comparative example of the present invention.

FIG. 4 shows Id-Vg characteristics when a voltage of −40 V to +40 V was applied to the back gate electrode of the thin film transistor having an N/r ratio of $8\times10^{-2}$ $(nm^{-1})$ and made in this example. FIG. 5 shows Id-Vg characteristics when a voltage of −40 V to +40 V was applied to the back gate electrode of the thin film transistor in the case of carrying out no treatments of this example (comparative example).

EXAMPLE 2

FIG. 6 shows a sectional structure of the semiconductor portion in the thin film transistor of the second embodiment of the present invention. The thin film transistor had the same structure and was made by the same process as in the thin film transistor shown in FIG. 1, except for the method of formation of the porous portion in the surface portion of the semiconductor and the shape of the voids. After the formation of the contact layer 105 among the source electrode 106 and the drain electrode 107 and the semiconductor layer 104, the porous portion of the surface of the semiconductor was formed in the following manner. The gate electrode was used as an anode and platinum was used as a cathode, and both the electrodes were dipped in hydrofluoric acid having a concentration of 20 volume %, followed by passing a current between these electrodes so as to give an anode current density of 1 $A/dm^2$. By passing the current for 5 seconds, the area of 30 nm in depth from the surface of the semiconductor layer was made porous.

EXAMPLE 3

This example shows a thin film transistor having the same structure and made in the same process as in the thin film transistor of the first embodiment shown in Example 1, except for the method of formation of the surface porous portion of the semiconductor. After the formation of the contact layer 105 among the source electrode 106 and the drain electrode 107 and the semiconductor layer 104, the porous portion of the surface of the semiconductor as shown in FIG. 6 was formed in the following manner.

A self-organized resist prepared by living polymerization of two macromolecules differing in molecular weight, such as polystyrene and polyisoprene, was coated on the surface of the semiconductor exposed between the source electrode and the drain electrodes. When molecular weight of the polyisoprene was not more than 0.3 based on the molecular weight of the polystyrene, the polyisoprene smaller in molecular weight was self-organized in the spherical form. The self-organized portion was exposed to ozone gas to selectively remove that portion, thereby forming a resist pattern having holes of several nm. Only the semiconductor under the holes was selectively dry etched to make porous the surface of the semiconductor to give voids of several nm in radius.

EXAMPLE 4

FIG. 7 shows a planar structure of one embodiment of a picture element portion on a TFT substrate in the active matrix display device in which the thin film transistor of the present invention was used as a switching element, and one example of the sectional structure taken on the line (A)–(A') of the picture element portion shown in the planar structure. The opposing substrate is not shown. The reference numeral 101 indicates an insulating glass substrate, 102 indicates a gate electrode (scan wiring) comprising Cr, 103 indicates a first gate insulating film comprising silicon nitride, 104 indicates a semiconductor layer comprising amorphous silicon and having a porous portion (104') in the area of 1 nm to 30 nm from the surface, 105 indicates a contact layer comprising n+ type amorphous silicon doped with phosphorus, 106 and 107 indicate source and drain electrodes (signal wiring) comprising Cr, respectively, 108 indicates a passivation film comprising polyimide, 701 functions as a storage capacitance electrode (or an electrode of a storage capacitance), 702 indicates a picture element electrode, and 703 indicates a contact hole.

The TFT substrate was made, for example, in the following manner. First, a Cr film of about 120 nm thick was formed by a sputtering method on a CORNING 1737 glass substrate 101. This Cr film was subjected to patterning by photolithography to form a gate electrode 102 and a storage capacitance electrode 701 formed of a part of scanning wiring. Thereon were formed successively a silicon nitride layer 103 of 300 nm thick, an amorphous silicon layer of 200 nm thick and an n$^+$ type amorphous silicon layer of 30 nm thick containing phosphorus by a plasma chemical vapor deposition (CVD) method. The n$^+$ type amorphous silicon layer and the amorphous silicon layer were simultaneously processed in the form of islands by photolithography, thereby forming a semiconductor layer 104.

A Cr film of about 120 nm thick formed thereon using a sputtering method was subjected to patterning by photolithography to form a source electrode 106 and a signal wiring 107. Furthermore, the n$^+$ type amorphous silicon layer on the semiconductor layer 104 which was not covered with the source electrode 106 and the drain electrode 107, the n$^+$ type amorphous silicon layer between the source/drain electrodes and the portion of the semiconductor layer of 50 nm in depth from the surface in which phosphorus might diffuse were removed by etching to form a contact layer 105 among the source electrode 106, the drain electrode 107 and the semiconductor layer 104. Then, the surface portion of 1 nm to 30 nm in depth from the surface of the semiconductor layer 104 which was not covered with the source electrode 106 and the drain electrode 107 was made porous by one of the methods described in Examples 1–3. Thereon was further formed a passivation film 108 of 1 μm thick comprising polyimide by a spin coating method. Furthermore, the passivation film may be a silicon nitride film of 300 nm thick deposited by a plasma CVD method using a mixed gas comprising SiH$_4$, NH$_3$, N$_2$, and the like. After a contact hole 703 was formed in the passivation film 108 and the gate insulating film 103 by photolithography, for example, an Al film of 140 nm thick was formed by a sputtering method, followed by subjecting the Al film to patterning by photolithography to form a picture element electrode 702. Moreover, at the time of the patterning, holes for light transmission may be formed through the picture element electrode.

The picture element electrode 702 and the source electrode 106 were connected through the contact hole 703.

Then, an orientation film of 200 nm thick was formed by a spin coating method. Thus, a TFT substrate was completed.

In FIG. 7, the thin film transistor and the picture element electrode partially overlapped with the passivation film being present therebetween. By such construction, the luminance of the liquid crystal display device was improved.

In FIG. 7, the opposing substrate not shown was made in the following manner. First, a color filter of 500 nm thick was formed on a substrate comprising CORNING GLASS 1737 by a spin coating method. Thereon were formed a passivation film of 500 nm thick and an orientation film of 200 nm thick by a spin coating method.

The surface of the orientation film of the opposing substrate for the thin film transistor was subjected to an orientation treatment, and then a liquid crystal composition was enclosed in a cell gap formed by opposing them so as to hold beads of about 40 μm in diameter comprising silicon oxide, thereby to form a liquid crystal layer. Finally, polarizing sheets were applied to the surfaces of the thin film transistor substrate and the opposing substrate to complete a liquid crystal panel.

When the source electrode 106 and the picture element electrode 702 of the thin film transistor made by the above method were cut, and a voltage of −40 V to 40 V was applied to the picture element electrode 702, the results of measurement of Id-Vg characteristics were the same as in FIG. 5. The current value between the source and drain electrodes in the case of applying a voltage of −40 V to +40 V to the back gate was not more than 10 times the current value between the source and drain electrodes in the case of providing no back gate electrode, and the liquid crystal display device also showed good display characteristics.

EXAMPLE 5

Figure 8:
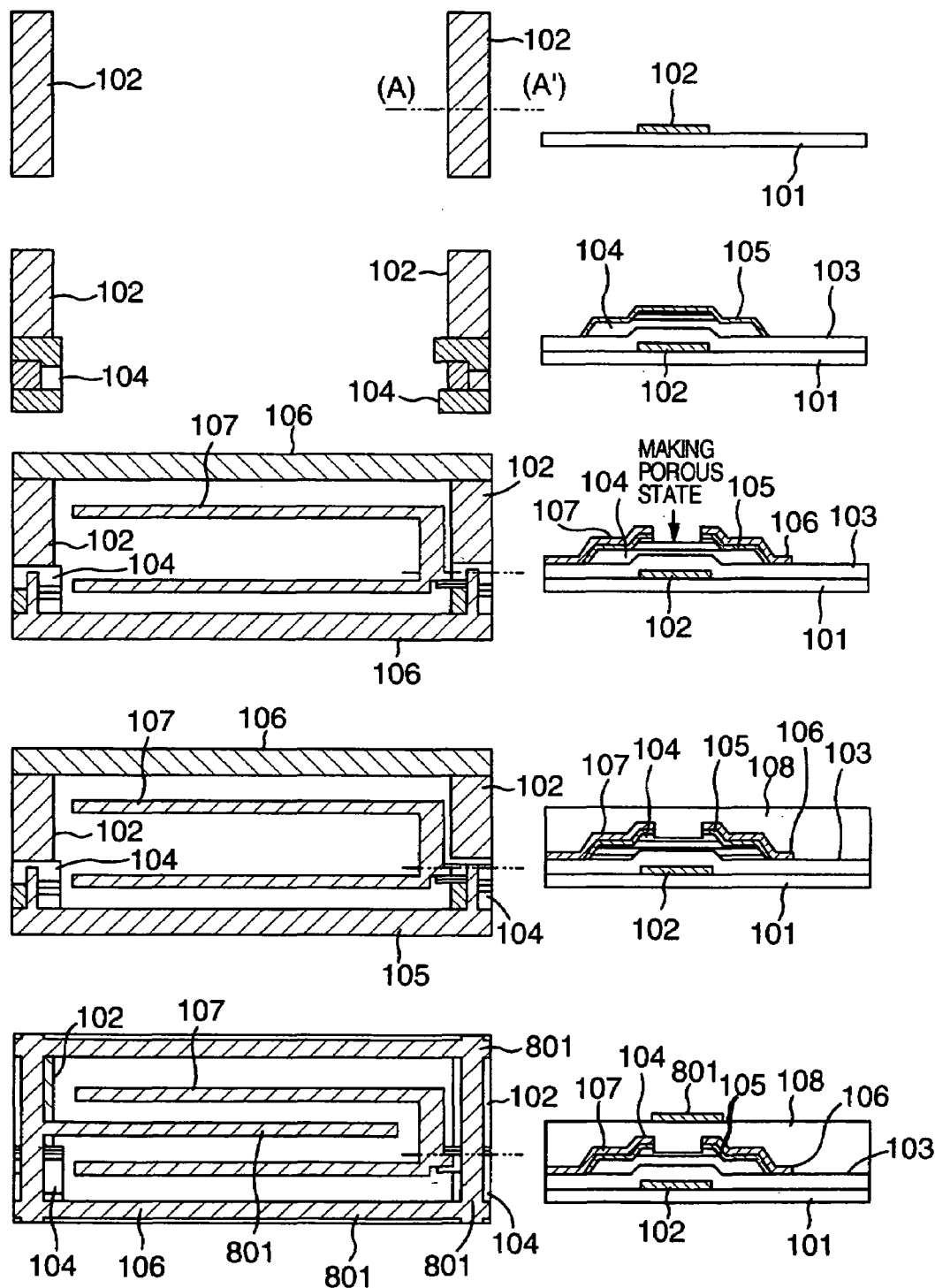
FIG. 8 is a view showing another embodiment of a planar structure and a sectional structure of the picture element portion in the liquid crystal display device of the present invention.

FIG. 8 shows a planar structure of another embodiment of the picture element portion on the TFT substrate in the active matrix display device in which the thin film transistor of the present invention is used as a switching element, and one example of the sectional structure taken on the line (A)–(A') of the picture element portion shown in the planar structure. The opposing substrate is not shown. The reference numeral 101 indicates an insulating glass substrate, 102 indicates a gate electrode (scanning wiring) comprising Cr, 103 indicates a first gate insulating film comprising silicon nitride, 104 indicates a semiconductor layer comprising amorphous silicon having a porous portion (104') in the area of 1 nm to 30 nm from the surface, 105 indicates a contact layer comprising n$^+$ type amorphous silicon doped with phosphorus, 106 and 107 indicate source and drain electrodes (signal wiring) comprising Cr, respectively, and 108 indicates a passivation film comprising polyimide.

The TFT substrate was made, for example, in the following manner. First, a Cr film of about 120 nm thick was formed by a sputtering method on a CORNING 1737 glass substrate 101. This Cr film was subjected to patterning by photolithography to form a gate electrode 102 as a scanning wiring. Thereon were formed successively a silicon nitride layer of 300 nm thick, an amorphous silicon layer of 200 nm thick and an n$^+$ type amorphous silicon layer of 30 nm thick containing phosphorus by a plasma chemical vapor deposition (CVD) method. The n$^+$ type amorphous silicon layer and the amorphous silicon layer were simultaneously processed in the form of islands by photolithography, thereby forming a semiconductor layer 104.

A Cr film of about 120 nm thick formed thereon using a sputtering method was subjected to patterning by photolithography to form a source electrode 106 and a signal wiring 107. Furthermore, the n$^+$ type amorphous silicon layer on the semiconductor layer 104 which was not covered with the source electrode 106 and the drain electrode 107, the n$^+$ type amorphous silicon layer between the source/drain electrodes and the portion of the semiconductor layer of 50 nm in depth from the surface in which phosphorus might diffuse were removed by etching to form a contact layer 105 among the source electrode 106, the drain electrode 107 and the semiconductor layer 104. Then, the surface portion of 1 nm to 30 nm in depth from the surface of the semiconductor layer 104 which was not covered with the source electrode 106 and the drain electrode 107 was made porous by any one of the methods described in Examples 1–3. Thereon was further formed a passivation film 108 of 1 μm thick comprising polyimide by a spin coating method. Furthermore, the passivation film may be a silicon nitride film of 300 nm thick deposited by a plasma CVD method using a mixed gas comprising SiH$_4$, NH$_3$, N$_2$, and the like. After, for example, a Cr film of 140 nm thick was formed by a sputtering method, followed by subjecting the Cr film to patterning by photolithography to form a common electrode 801.

Then, an orientation film of 200 nm thick was formed by a spin coating method. Thus, a TFT substrate was completed.

In FIG. 8, the thin film transistor and the common electrode partially overlapped with the passivation film being present therebetween. By such construction, the luminance of the liquid crystal display device was improved.

The opposing substrate not shown in FIG. 8 was made in the following manner. First, a color filter of 500 nm thick was formed on a substrate comprising CORNING GLASS 1737 by a spin coating method. Thereon were formed a passivation film of 500 nm thick and an orientation film of 200 nm thick by a spin coating method.

The surface of the orientation film of the opposing substrate for the thin film transistor was subjected to an orientation treatment, and, then, a liquid crystal composition was enclosed in a cell gap formed by opposing them so as to hold beads of about 40 μm in diameter comprising silicon oxide, thereby to form a liquid crystal layer. Finally, polarizing sheets were applied to the surfaces of the thin film transistor substrate and the opposing substrate to complete a liquid crystal panel.

The results of measurement of Id-Vg characteristics in the case of applying a voltage of −40 V to 40 V to the common electrode 801 of the thin film transistor made by the above method were the same as in FIG. 5. The current value between the source and drain electrodes in the case of applying a voltage of −40 V to +40 V to the back gate was not more than 10 times the current value between the source and drain electrodes in the case of providing no back gate electrode, and the liquid crystal device also showed good display characteristics.

As mentioned above, there can be provided thin film transistors which can be inhibited from causing back channel leak current produced by the influence of fixed charge in the passivation film or potential of the wiring and picture element electrode. Therefore, active matrix display devices of high performance and high productivity can be provided in which a coating type passivation film such as of polyimide or polydisilazane is used as the passivation film or a picture element electrode used as a reflective electrode is provided above the thin film transistor.

Thus, according to the present invention, active matrix display devices of high performance and high productivity can be provided.

What is claimed is:

1. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and the surface portion of the semiconductor layer on the passivation film side is porous, wherein depth of the porous portion is not less than 1 nm and not more than 30 nm from the surface of the semiconductor layer on the passivation film side.

2. An active matrix display device according to claim 1, wherein said surface portion of the semiconductor layer is an amorphous Si region formed on the semiconductor layer.

3. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and the surface portion of the semiconductor layer on the passivation film side is porous, wherein not less than 0.01 atom % and not more than 0.1 atom % of helium is contained in the porous area of not more than 30 nm in depth from the surface of the semiconductor layer on the passivation film side.

4. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and the surface portion of the semiconductor layer on the passivation film side is porous, wherein the current value between the source electrode and the drain electrode in the case of applying a voltage of −40 V to +40 V to a second electrode (a back gate electrode) provided on the switching element is not more than 10 times the current value between the source electrode and the drain electrode in the case of providing no back gate electrode.

5. An active matrix display device, using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and means, formed on a surface portion of the semiconductor layer between the semiconductor layer and the passivation film, for preventing fixed charges from the passivation film from entering the semiconductor layer, wherein said means comprises a porous semiconductor region formed between semiconductor layer and said passivation film, and wherein depth of the porous semiconductor region is not less than 1 nm and not more than 30 nm from the surface of the semiconductor layer on the passivation film side.

6. An active matrix display device according to claim 5, wherein the passivation film is of an organic resin.

7. An active matrix display device according to claim 5, wherein a picture element electrode formed on the passivation film of the switching element overlaps the switching element.

8. An active matrix display device according to claim 5, wherein a common electrode formed on the passivation film of the switching element overlaps the switching element.

9. An active matrix display device according to claim 5, wherein said porous semiconductor region is an amorphous Si region.

10. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and means, formed on a surface portion of the semiconductor layer between the semiconductor layer and the passivation film, for preventing fixed charges from the passivation film from entering the semiconductor layer, wherein said means comprises a porous semiconductor region formed between semiconductor layer and said passivation film, and wherein volume of the voids is not less than 5% in the porous semiconductor region of not less than 1 nm and not more than 30 nm from the surface of the semiconductor layer on the passivation film side.

11. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and means, formed on a surface portion of the semiconductor layer between the semiconductor layer and the passivation film, for preventing fixed charges from the passivation film from entering the semiconductor layer, wherein said means comprises a porous semiconductor region formed between semiconductor layer and said passivation film, and wherein not less than 0.01 atom % and not more than 0.1 atom % of helium is contained in the porous semiconductor region of not more than 30 nm in depth from the surface of the semiconductor layer on the passivation film side.

12. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and means, formed on a surface portion of the semiconductor layer between the semiconductor layer and the passivation film, for preventing fixed charges from the passivation film from entering the semiconductor layer, wherein said means comprises a porous semiconductor region formed between semiconductor layer and said passivation film, and wherein the current value between the source electrode and the drain electrode in the case of applying a voltage of −40 V to +40 V to a second electrode (a back gate electrode) provided on the switching element is not more than 10 times the current value between the source electrode and the drain electrode in the case of providing no back gate electrode.

13. An active matrix display device using a thin film transistor as a switching element in the displaying portion or driving portion wherein said thin film transistor comprises an insulating substrate on which a gate electrode, a gate insulating film, a semiconductor layer, a drain electrode, a source electrode and a passivation film are successively laminated, and the surface portion of the semiconductor layer on the passivation film side is porous, wherein volume of the voids is not less than 5% in the porous area of not less than 1 nm and not more than 30 nm from the surface of the semiconductor layer on the passivation film side.

* * * * *